US012768906B2

(12) United States Patent
Nishimachi

(10) Patent No.: US 12,768,906 B2
(45) Date of Patent: Oct. 20, 2026

(54) DETERIORATION DETERMINATION DEVICE, AND POWER CONVERSION DEVICE

(71) Applicant: DENSO CORPORATION, Kariya-city (JP)

(72) Inventor: Seiichiro Nishimachi, Kariya-city (JP)

(73) Assignee: DENSO CORPORATION, Kariya (JP)

(*) Notice: Subject to any disclaimer, the term of this patent is extended or adjusted under 35 U.S.C. 154(b) by 477 days.

(21) Appl. No.: 18/476,850

(22) Filed: Sep. 28, 2023

(65) Prior Publication Data

US 2024/0019503 A1 Jan. 18, 2024

Related U.S. Application Data

(63) Continuation of application No. PCT/JP2022/012375, filed on Mar. 17, 2022.

(30) Foreign Application Priority Data

Apr. 2, 2021 (JP) ................................ 2021-063599

(51) Int. Cl.
*G01R 31/64* (2020.01)
*H02M 3/158* (2006.01)
*H02M 7/537* (2006.01)

(52) U.S. Cl.
CPC ............ *G01R 31/64* (2020.01); *H02M 3/158* (2013.01); *H02M 7/537* (2013.01)

(58) Field of Classification Search
CPC . G01R 31/392; G01R 31/389; G01R 31/2628
See application file for complete search history.

(56) References Cited

U.S. PATENT DOCUMENTS

2009/0160252 A1* 6/2009 Kojima ................. B60W 10/28 307/24
2009/0228221 A1* 9/2009 Kakiuchi ........... G01R 27/2605 702/58
2012/0223670 A1* 9/2012 Kinjo ........................ H02J 7/35 320/135
2016/0276935 A1* 9/2016 Arai ...................... B60L 3/0023
(Continued)

FOREIGN PATENT DOCUMENTS

JP H05-215800 A 8/1993
JP 2012-115018 A 6/2012
(Continued)

*Primary Examiner* — Giovanni Astacio-Oquendo
*Assistant Examiner* — Temilade S Rhodes-Vivour
(74) *Attorney, Agent, or Firm* — Oliff PLC

(57) ABSTRACT

A deterioration determination device that determines deterioration of a reactor and a smoothing capacitor included in a power conversion device, includes: a storage unit that stores a charge determination value based on a voltage change when the smoothing capacitor with no deterioration is charged by a power source electric power supplied through the reactor with no deterioration; and a calculation unit that determines at least one of the reactor and the smoothing capacitor has deteriorated when the voltage change the smoothing capacitor during charging by the power source electric power supplied through the reactor is larger than the charge determination value.

12 Claims, 4 Drawing Sheets

(56) References Cited

U.S. PATENT DOCUMENTS

| | | | | |
|---|---|---|---|---|
| 2018/0026539 | A1* | 1/2018 | Kobayashi | G01R 19/165<br>323/271 |
| 2021/0099102 | A1 | 4/2021 | Tahata et al. | |
| 2021/0293894 | A1* | 9/2021 | Tsukuta | H02M 5/4585 |

FOREIGN PATENT DOCUMENTS

| | | | |
|---|---|---|---|
| JP | 2016-111080 | A | 6/2016 |
| JP | 2017-112792 | A | 6/2017 |
| JP | 2018-004523 | A | 1/2018 |

* cited by examiner

DETERIORATION DETERMINATION DEVICE, AND POWER CONVERSION DEVICE

CROSS REFERENCE TO RELATED APPLICATIONS

The present application is a continuation application of International Patent Application No. PCT/JP2022/012375 filed on Mar. 17, 2022, which designated the U.S. and claims the benefit of priority from Japanese Patent Application No. 2021-063599 filed on Apr. 2, 2021. The entire disclosures of all of the above applications are incorporated herein by reference.

TECHNICAL FIELD

The disclosure described in this specification relates to a deterioration determination device and a power conversion device.

BACKGROUND

According to a conceivable technique, a capacitor deterioration diagnosis device is known. The capacitor deterioration diagnosis device determines the deterioration of an aluminum electrolytic capacitor based on the humidity of the ambient air around the aluminum electrolytic capacitor included in the inverter device.

SUMMARY

According to an example, a deterioration determination device that determines deterioration of a reactor and a smoothing capacitor included in a power conversion device, may include: a storage unit that stores a charge determination value based on a voltage change when the smoothing capacitor with no deterioration is charged by a power source electric power supplied through the reactor with no deterioration; and a calculation unit that determines at least one of the reactor and the smoothing capacitor has deteriorated when the voltage change the smoothing capacitor during charging by the power source electric power supplied through the reactor is larger than the charge determination value.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
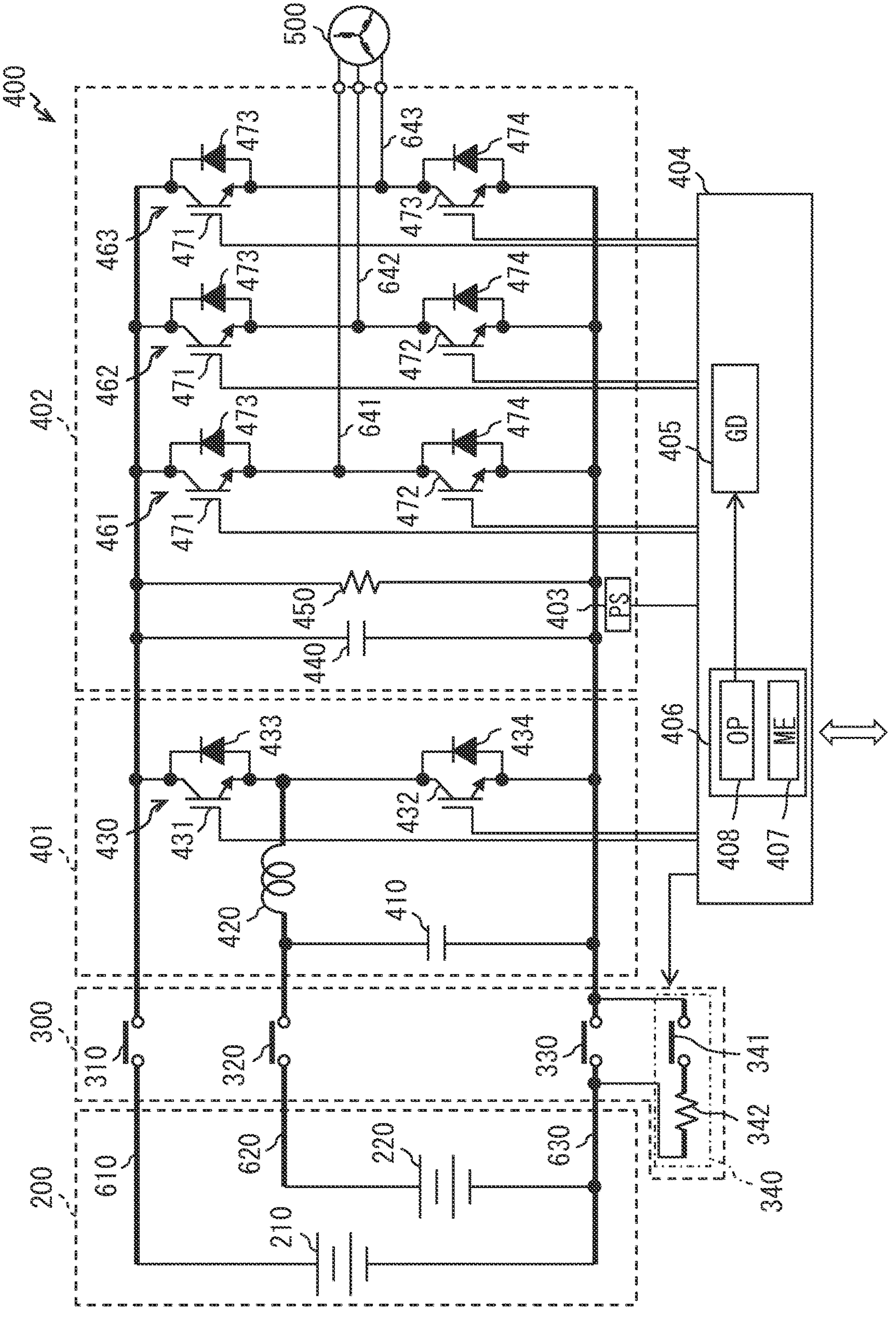
FIG. 1 is a circuit diagram illustrating an in-vehicle system.

The technical content in the conceivable technique is specialized for determining the deterioration of an aluminum electrolytic capacitor. Therefore, with the technical content in the conceivable technique, it is difficult to determine the deterioration of other passive elements included in the device that performs electric power conversion.

An object of the present embodiments is to provide a deterioration determination device and a power conversion device capable of determining deterioration of different types of passive elements.

A deterioration determination device according to one aspect of the present embodiments is a deterioration determination device that determines deterioration of a reactor and a smoothing capacitor included in an electric power conversion device.

The deterioration determination device includes:

- a storage unit that stores a charge determination value based on a voltage change when a smoothing capacitor with no deterioration is charged by a power source electric power supplied through a reactor with no deterioration; and
- a calculation unit that determines that at least one of the reactor and the smoothing capacitor is deteriorated when the voltage change during charging of the smoothing capacitor by the power source electric power supplied through the reactor is greater than the charge determination value.

A deterioration determination device according to one aspect of the present embodiments is a deterioration determination device that determines deterioration of a reactor and a smoothing capacitor included in an electric power conversion device.

The deterioration determination device includes:

- a storage unit that stores a charge expectation time expected for completion of charging of the smoothing capacitor with no deterioration by the power source electric power supplied through the reactor with no deterioration; and
- a calculation unit that determines that at least one of the reactor and the smoothing capacitor is deteriorated when a charging time from a start to an end of charging the smoothing capacitor by the power source electric power supplied through the reactor is shorter than the charge expectation time.

An electric power conversion device according to one aspect of the present embodiments includes:

- a reactor to which a power source electric power is supplied;
- a smoothing capacitor charged by the power source electric power supplied through the reactor;
- a storage unit that stores a charge determination value based on a voltage change when a smoothing capacitor with no deterioration is charged by the power source electric power supplied through the reactor with no deterioration; and
- a calculation unit that determines that at least one of the reactor and the smoothing capacitor is deteriorated when a voltage change during charging of the smoothing capacitor is higher than the charge determination value.

According to this, it is possible to determine the deterioration of the reactor and the smoothing capacitor. Thus, the deterioration determination of different types of passive elements can be performed.

The reference numerals in parentheses above indicate only a correspondence relationship with the configuration described in the embodiment to be described later, and do not limit the technical range in any way.

The following describe embodiments for carrying out the present disclosure with reference to the drawings. In each embodiment, parts corresponding to the elements described in the preceding embodiments are denoted by the same reference numerals, and redundant explanation may be omitted. When only a part of the configuration is described in each embodiment, another embodiment described previously may be applied to the other parts of the configuration.

When, in each embodiment, it is specifically described that combination of parts is possible, the parts can be combined. In a case where any obstacle does not especially occur in combining the parts of the respective embodiments, it is possible to partially combine the embodiments, the embodiment and the modification, or the modifications even when it is not explicitly described that combination is possible.

First Embodiment

<In-Vehicle System>

First, an in-vehicle system 100 will be described based on FIG. 1. This in-vehicle system 100 constitutes a system of an electric vehicle such as an electric car. The in-vehicle system 100 has a battery 200, a system switch 300, a power conversion device 400, and a motor 500.

The in-vehicle system 100 includes a P bus bar 610, an M bus bar 620, and an N bus bar 630 as components for electrically connecting various electrical elements included in the above components. The in-vehicle system 100 also includes a U busbar 641, a V busbar 642, and a W busbar 643.

Various electrical components included in the battery 200, the system switch 300, and the power conversion unit 400 are electrically connected via the P bus bar 610, the M bus bar 620, and the N bus bar 630. Various electrical components included in the power converter 400 and the motor 500 are electrically connected via a U busbar 641, a V busbar 642 and a W busbar 643.

The in-vehicle system 100 further includes a plurality of electronic control units (ECUs). The ECUs transmit electric signals to and receive electric signals from each other via a bus wiring. A plurality of ECUs cooperate to control the electric vehicle. The ECUs control the regeneration and power running of the motor 500 according to a SOC of the battery 200. The SOC is an abbreviation for state of charge. The ECU is an abbreviation of electronic control unit.

<Battery>

The battery 200 has a first battery 210 and a second battery 220. Each of the first battery 210 and the second battery 220 has a plurality of battery stacks. A plurality of battery stacks are electrically connected in series or in parallel. A configuration in which at least one of the first battery 210 and the second battery 220 has one battery stack can also be adopted.

The battery stack has a plurality of secondary batteries electrically connected in series. As the secondary batteries, a lithium ion secondary battery, a nickel hydrogen secondary battery, an organic radical battery, or the like may be employed.

A P bus bar 610 is connected to the positive electrode of the first battery 210. An M busbar 620 is connected to the positive electrode of the second battery 220. An N busbar 630 is connected to the negative electrodes of the first battery 210 and the second battery 220.

The negative electrode of the first battery 210 and the negative electrode of the second battery 220 are always electrically connected via the N bus bar 630. Therefore, the potentials of the negative electrodes of the first battery 210 and the second battery 220 are the same.

<System Switch>

The system switch 300 controls energization and cut off between the battery 200 and the electric power conversion device 400. The system switch 300 has a first SMR 310, a second SMR 320 and a third SMR 330. The SMR is an abbreviation for System Main Relay.

Each of the first SMR 310, the second SMR 320, and the third SMR 330 is a mechanical switch. The mechanical switch is a normally closed switch that is energized when no control signal is input.

The first SMR 310 is provided in the P bus bar 610. The second SMR 320 is provided in the M bus bar 620. The third SMR 330 is provided in the N bus bar 630.

The first SMR 310 and the third SMR 330 control energization and cut-off between the first battery 210 and the electric power conversion device 400. The second SMR 320 and the third SMR 330 control energization and cut-off between the second battery 220 and the electric power conversion device 400. The first SMR 310 and the second SMR 320 control energization and cut-off between the positive electrode of the first battery 210 and the positive electrode of the second battery 220.

The system switch 300 has a precharge circuit 340 in addition to the above components. The precharge circuit 340 has a charging switch 341 and a charging resistor 342. The charging switch 341 and the charging resistor 342 are connected in series to form a series circuit.

In this embodiment, the precharge circuit 340 is connected in parallel with the third SMR 330. The precharge circuit 340 constitutes a detour path for the third SMR 330.

The charge switch 341 is controlled to be in a cut-off state when the third SMR 330 is in an energization state. The charge switch 341 is controlled to be in the energization state when the third SMR 330 is in the cut-off state. The charging switch 341 is controlled to be in the energization state when charging the smoothing capacitor 440, which will be described later.

<Electric Power Conversion Device>

The electric power conversion device 400 performs electric power conversion between the battery 200 and the motor 500. The electric power conversion device 400 includes a converter 401, an inverter 402, a physical quantity sensor 403 and a control board 404.

The converter 401 steps up (boosts) the DC power of the battery 200 to a voltage level suitable for the power running of the motor 500. The inverter 402 converts the DC power into an AC power. This AC power is supplied to the motor 500.

The inverter 402 converts an AC power generated by a power generation (i.e., regeneration) of the motor 500 into a DC power. The converter 401 steps down the DC power to a voltage level suitable for charging the battery 200. This stepped-down DC power is supplied to the battery 200 and various electrical loads.

The physical quantity sensor 403 detects physical quantities of the converter 401 and the inverter 402. The physical quantities detected by the physical quantity sensor 403 include, for example, temperature, current, and voltage. The physical quantity sensor 403 is provided in various electrical components included in the converter 401 and the inverter 402 and various busbars described above.

The control board 404 functions to control the switches included in the converter 401 and the inverter 402 between the energization state and the cut-off state. The control board 404 of this embodiment also has a function of controlling the switches included in the system switch 300 between the energization state and the cut-off state.

This control board 404 includes a gate driver 405. In this embodiment, the control board 404 includes one EV ECU 406 among a plurality of ECUs. In the drawing, the gate driver 405 is written as GD.

A configuration in which the gate driver 405 and the EV ECU 406 are included in separate substrates can also be adopted. In the case of such a configuration, the board including the gate driver 405 and the board including the EVECU 406 are electrically connected via a wire harness, for example.

The physical quantity detected by the physical quantity sensor 403 is input to the control board 404. Vehicle conditions are input to the control board 404 from other ECUs. The EV ECU 406 generates a control signal for controlling the switch based on various types of input information. This control signal is input to the gate driver 405. In the drawing, transmission and reception of electrical signals between the EV ECU 406 and other ECUs are indicated by an outline white arrows.

The gate driver 405 amplifies the input control signal. This amplified control signal is input to the switches included in the system switch 300, the converter 401 and the inverter 402. As a result, the switch is controlled between the energization state and the cut-off state.

<Motor>

The motor 500 is connected to an output shaft of an electric vehicle (not shown). The rotation energy of the motor 500 is transmitted to driving wheels of the electric vehicle via the output shaft. On the contrary, the rotation energy of the driving wheels is transmitted to the motor 500 via the output shaft.

The motor 500 is power running by an AC power supplied from the electric power conversion device 400. This gives the driving force to the driving wheels. Further, the motor 500 is regenerated by the rotation energy transmitted from the driving wheels. An AC power generated by this regeneration is converted into a DC power and is stepped down by the electric power conversion device 400. This DC power is supplied to the battery 200. The DC power is also supplied to various electric loads mounted on the electric vehicle.

A configuration in which the battery 200 includes a fuel cell may also be adopted. In this case, the AC power generated by regeneration is no longer used for charging battery 200.

<Detailed Configuration of Electric Power Conversion Device>

Next, the detailed configuration of the electric power conversion device 400 will be described. As described above, the electric power conversion device 400 includes the converter 401 and the inverter 402.

The converter 401 is electrically connected to the first battery 210 via the P bus bar 610 and the N bus bar 630. Further, the converter 401 is electrically connected to the second battery 220 via the M bus bar 620 and the N bus bar 630. Electrical connection between the converter 401 and the battery 200 is controlled by the system switch 300.

Further, the inverter 402 is electrically connected to the converter 401 via the P bus bar 610 and the N bus bar 630. In addition, the inverter 402 is electrically connected to the stator coil of the motor 500 via the U busbar 641, the V busbar 642, and the W busbar 643. Electrical connection between the inverter 402 and the battery 200 is controlled by the system switch 300. Specifically, the electrical connection state between the inverter 402 and the second battery 220 is also controlled by the converter 401.

<Converter>

The converter 401 has a filter capacitor 410, a reactor 420 and an A-phase switch module 430. One of the two electrodes of a filter capacitor 410 is connected to the M bus bar 620. The other of the two electrodes of the filter capacitor 410 is connected to the N bus bar 630. The reactor 420 is provided in the M bus bar 620. The A-phase switch module 430 is connected to the P bus bar 610, the M bus bar 620, and the N bus bar 630, respectively.

The A-phase switch module 430 has a first switch 431 and a second switch 432. The A-phase switch module 430 also has a first diode 433 and a second diode 434. These semiconductor elements are covered with a sealing resin.

In this embodiment, n-channel IGBTs are used as the first switch 431 and the second switch 432. As shown in FIG. 1, the emitter electrode of the first switch 431 and the collector electrode of the second switch 432 are connected. Thereby, the first switch 431 and the second switch 432 are electrically connected in series.

Also, the cathode electrode of the first diode 433 is connected to the collector electrode of the first switch 431. An anode electrode of the first diode 433 is connected to the emitter electrode of the first switch 431. As a result, the first diode 433 is connected in anti-parallel to the first switch 431.

Similarly, the cathode electrode of the second diode 434 is connected to the collector electrode of the second switch 432. An anode electrode of the second diode 434 is connected to the emitter electrode of the second switch 432. As a result, the second diode 434 is connected in anti-parallel to the second switch 432.

Terminals are connected to collector electrodes, emitter electrodes, and gate electrodes of the first switch 431 and the second switch 432, respectively. The tips of these terminals are exposed outside the sealing resin. Tips of these terminals are selectively connected to the P bus bar 610, the M bus bar 620, the N bus bar 630 and the control board 404.

A collector electrode of the first switch 431 is connected to the P bus bar 610. An emitter electrode of the first switch 431 and a collector electrode of the second switch 432 are connected to the M busbar 620. An emitter electrode of the second switch 432 is connected to the N busbar 630.

Thereby, the first switch 431 and the second switch 432 are connected in series in the order from the P bus bar 610 toward the N bus bar 630. The reactor 420 provided in the M busbar 620 is connected to a midpoint between the first switch 431 and the second switch 432.

The first SMR 310 is provided between the connection point of the P bus bar 610 with the first battery 210 and the connection point of first switch 431 with the P bus bar 610. The second SMR 320 is provided between the reactor 420 and a connection point of the second battery 220 with the M bus bar 620. The third SMR 330 is provided between the connection point of the N bus bar 630 with the first battery 210 and the connection point of second switch 432 with the N bus bar 630. The third SMR 330 is provided between the connection point of the N bus bar 630 with the second battery 220 and the connection point of second switch 432 with the N bus bar 630.

Therefore, when the first SMR 310 and the third SMR 330 are in the energization state while the second SMR 320 is in the cut off state, the electric power source voltage of the first battery 210 is applied to both ends of the first switch 431 and the second switch 432 connected in series. When the second SMR 320 and the third SMR 330 are in the energization state while the first SMR 310 is in the cut off state, the electric power source voltage of the second battery 220 is applied to both ends of the second switch 432.

Gate electrodes of the first switch 431 and the second switch 432 are connected to the control substrate 404. A control signal is input to this gate electrode. As a result, the first switch 431 and the second switch 432 are controlled to be in the energization state and the cut-off state, respectively.

Semiconductors such as Si and wide-gap semiconductors such as SiC can be used as the constituent materials of the semiconductor elements included in the converter 401. The constituent material of the semiconductor element may not be particularly limited.

As the first switch 431 and the second switch 432 included in this semiconductor element, MOSFETs can be used instead of IGBTs. The type of switch element to be employed may not be particularly limited.

<Inverter>

The inverter 402 has a smoothing capacitor 440 and a discharge resistor 450. The inverter 402 also has a U-phase switch module 461, a V-phase switch module 462, and a W-phase switch module 463. These various components are electrically connected in parallel between the P bus bar 610 and the N bus bar 630.

The smoothing capacitor 440 has a larger capacitance than filter capacitor 410. When the power conversion device 400 is used, the smoothing capacitor 440 becomes in the full charge state. When the power conversion device 400 is not in use, the smoothing capacitor 440 becomes in the discharge state.

One of the two electrodes of the smoothing capacitor 440 is connected to the P bus bar 610. The other of the two electrodes of the smoothing capacitor 440 is connected to the N bus bar 630.

The discharge resistor 450 functions to convert electric charges accumulated in the smoothing capacitor 440 into heat energy when the power conversion device 400 is not in use. One end of the discharge resistor 450 is connected to the P busbar 610. The other end of discharge resistor 450 is connected to N bus bar 630.

The smoothing capacitor 440 and the discharge resistor 450 are connected to each other via the P bus bar 610 and the N bus bar 630. A closed loop including the smoothing capacitor 440 and the discharge resistor 450 is configured. When the power conversion device 400 is not in use, the charge accumulated in the smoothing capacitor 440 flows through this closed loop. The charge flowing through this closed loop is converted into heat energy by the discharge resistor 450.

Each of the U-phase switch module 461 to W-phase switch module 463 has a third switch 471 and a fourth switch 472. Also, each of the U-phase switch module 461 to the W-phase switch module 463 has a third diode 473 and a fourth diode 474. These semiconductor elements are covered with a sealing resin.

In this embodiment, n-channel IGBTs are used as the third switch 471 and the fourth switch 472. As shown in FIG. 1, the emitter electrode of the third switch 471 and the collector electrode of the fourth switch 472 are connected. Thereby, the third switch 471 and the fourth switch 472 are electrically connected in series.

Also, the cathode electrode of the third diode 473 is connected to the collector electrode of the third switch 471. An anode electrode of the third diode 473 is connected to the emitter electrode of the third switch 471. As a result, the third diode 473 is connected in anti-parallel to the third switch 471.

Similarly, the cathode electrode of the fourth diode 474 is connected to the collector electrode of the fourth switch 472. An anode electrode of the fourth diode 474 is connected to the emitter electrode of the fourth switch 472. As a result, the fourth diode 474 is connected in anti-parallel to the fourth switch 472.

Terminals are connected to collector electrodes, emitter electrodes, and gate electrodes of the third switch 471 and the fourth switch 472, respectively. The tips of these terminals are exposed outside the sealing resin. Tips of these terminals are selectively connected to the P bus bar 610, the N bus bar 630, the U bus bar 641, the V bus bar 642, the W bus bar 643 and the control board 404.

A collector electrode of the third switch 471 is connected to the P bus bar 610. An emitter electrode of the fourth switch 472 is connected to the N busbar 630. Thereby, the third switch 471 and the fourth switch 472 are connected in series in the order from the P bus bar 610 toward the N bus bar 630.

In the above described connection configuration, when the first SMR 310 and the third SMR 330 are in the energization state while the second SMR 320 is in the cut off state, the electric power source voltage of the first battery 210 is applied to both ends of the third switch 471 and the fourth switch 472 connected in series. When the second SMR 320 and the third SMR 330 are in the energization state while the first SMR 310 is in the cut off state, the electric power source voltage of the second battery 220 is applied to both ends of the third switch 471 and the fourth switch 472 connected in series.

A midpoint between the third switch 471 and the fourth switch 472 of the U-phase switch module 461 is connected to the U-phase stator coil of the motor 500 via the U busbar 641. A midpoint between the third switch 471 and the fourth switch 472 of the V-phase switch module 462 is connected to the V-phase stator coil of the motor 500 via the V busbar 642. A midpoint between the third switch 471 and the fourth switch 472 of the W-phase switch module 463 is connected to the W-phase stator coil of the motor 500 via the W busbar 643. Thus, the U-phase switch module 461 to W-phase switch module 463 are individually connected to the U-phase stator coil to W-phase stator coil of the motor 500.

Gate electrodes of the third switch 471 and the fourth switch 472 are connected to the control substrate 404. Thereby, the energization state and the cut-off state of each of the third switch 471 and the fourth switch 472 can be controlled by the control board 404.

Here, as the third switch 471 and the fourth switch 472, similarly to the converter 401, MOSFETs can be adopted instead of IGBTs. Similar to converter 401, a semiconductor such as Si, a wide-gap semiconductor such as SiC, or the like can be used as a constituent material of the semiconductor element included in inverter 402. The constituent material of the semiconductor elements included in inverter 402 and the constituent material of the semiconductor elements included in converter 401 may be the same or different.

<Physical Quantity Sensor>

As described above, the physical quantity sensor 403 detects physical quantities of the converter 401 and the inverter 402. Specifically, physical quantity sensor 403 detects the voltage of the smoothing capacitor 440 and the temperature of the reactor 420.

The physical quantity sensor 403 has a voltage sensor provided in the smoothing capacitor 440 and the P bus bar 610. The voltage of the smoothing capacitor 440 is detected by this voltage sensor.

The physical quantity sensor 403 has a temperature sensor provided in the reactor 420 or the switch of the power conversion device 400. The temperature sensor detects the temperature of the reactor 420.

The physical quantity sensor 403 may have a current sensor that detects direct current flowing through the P bus bar 610 and the M bus bar 620. The physical quantity sensor 403 may have a current sensor that detects alternating current flowing through the U busbar 641 the V busbar 642 and the W busbar 643.

<Control Board>

As noted above, the control board 404 includes the gate driver 405 and the EV ECU 406 The EV EU 406 has a storage unit 407 and a calculation unit 408 shown in FIG. 1.

The storage unit 407 is a non-transitory tangible storage medium that non-transitory stores data and programs that can be read by a computer or a processor. The storage unit 407 includes a volatile memory and a nonvolatile memory. The storage unit 407 stores various information input to the control board 404 and processing results of the calculation unit 408. The storage unit 407 stores various programs and various reference values for the calculation unit 408 to perform calculation process.

The calculation unit 408 has a processor. The calculation unit 408 stores various information input to the control board 404 in the storage unit 407. The calculation unit 408 executes various calculation processes based on the information stored in the storage unit 407.

The calculation unit 408 generates a control signal. This control signal is amplified by the gate driver 405. With this control signal, the switches included in system switch 300, the converter 401, and the inverter 402 are controlled to be in the energization state and the cut-off state.

<Switch Control>

When charging the smoothing capacitor 440, the EV ECU 406 controls the first SMR 310 in the cut-off state and the second SMR 320 in the energization state. At the same time, the EV ECU 406 controls the third SMR 330 in the cut-off state and the charge switch 341 in the energization state. Then, EV ECU 406 controls the switches included in the converter 401 and the inverter 402 in the cut off state.

As a result, the smoothing capacitor 440 is charged with the power source electric power supplied from second battery 220 via the reactor 420. In addition to the reactor 420, there are the first switch 431 and the first diode 433 in the energization path between the positive electrode of the second battery 220 and the smoothing capacitor 440. The EV ECU 406 may controls the first switch 431 in the energization state.

For example, when the SOC of the second battery 220 decreases significantly, the EV ECU 406 may control the first SMR 310 in the energization state and controls the second SMR 320 in the cut off state. As a result, the smoothing capacitor 440 is charged with the power source electric power supplied from the first battery 210.

After charging of the smoothing capacitor 440 is completed, the EV ECU 406 switches the third SMR 330 from the cut-off state to the energization state. Also, the EV ECU 406 switches the charging switch 341 from the energization state to the cut-off state. This eliminates the electric power consumption in the charging resistor 342. The power source electric power from the second battery 220 is supplied to various electric loads.

When driving the motor 500, the EV ECU 406 controls the first SMR 310 in the cut off state and controls the second SMR 320 in the energization state. At the same time, the EV ECU 406 controls the third SMR 330 in the energization state and the charge switch 341 in the cut off state. the EV ECU 406 controls the switches included in the converter 401 and the inverter 402 to be in the energization state and the cut-off state. Note that the EV ECU 406 may control the first SMR 310 in the energization state and control the second SMR 320 in the cut-off state.

the EV ECU 406 generates pulse signals as control signals for switches included in the converter 401 and the inverter 402. The EV ECU 406 adjusts the on-duty ratio and a frequency of this pulse signal. The on-duty ratio and the frequency are determined based on the physical quantity detected by physical quantity sensor 403 and vehicle information input from other ECUs. This vehicle information includes the rotation angle of the motor 500, the target torque of the motor 500, the SOC of the battery 200, and the like.

When increasing the voltage of the DC power source electric power supplied from the second battery 220, the EV ECU 406 fixes the first switch 431 of the A-phase switch module 430 to the cut-off state. At the same time, the EV ECU 406 sequentially switches the second switch 432 of the A-phase switch module 430 between the energization state and the cut off state.

When decreasing the voltage of the supplied DC electric power, the EV ECU 406 fixes the second switch 432 of the A-phase switch module 430 to the cut-off state. At the same time, the EV ECU 406 sequentially switches the first switch 431 of the A-phase switch module 430 between the energization state and the cut off state.

When power running the motor 500, the EV ECU 406 PWM-controls the third switch 471 and the fourth switch 472 provided in the U-phase switch module 461 to the W-phase switch module 463, respectively. In this way, three-phase alternating current is generated in the inverter 402.

When the motor 500 generates (or regenerates) the electric power, the EV ECU 406 stops outputting control signals to the third switch 471 and the fourth switch 472 of the U-phase switch module 461 to the W-phase switch module 463, respectively for example. As a result, the AC electric power generated by the motor 500 passes through the diodes of the U-phase switch module 461 to the W-phase switch module 463. As a result, the AC power is converted to the DC power.

When the smoothing capacitor 440 is to be discharged after completing the drive control of the motor 500, the EV ECU 406 controls the switches included in the system switch 300, the converter 401, and the inverter 402 into the cut off state. As a result, the charge accumulated in the smoothing capacitor 440 flows through the discharge resistor 450. This electric charge is actively converted into heat energy by the discharge resistor 450.

When adjusting the SOCs of the first battery 210 and the second battery 220, the EV ECU 406 controls the first SMR 310 and the second SMR 320 into an energization state. At the same time, the EV ECU 406 controls the third SMR 330 and the charging switch 341 into the cut off state. The EV ECU 406 controls the first switch 431 in the energization state. Then, the EV ECU 406 controls the switches included in the converter 401 and the inverter 402 in the cut off state.

Thereby, a closed loop including the first battery 210 and the second battery 220 is configured. The power source electric power is supplied via the first switch 431 and the reactor 420 to from the higher one of the output voltage of the first battery 210 and the second battery 220 to the lower one of the output voltage of the first battery 210 and the second battery 220. Although the SOC of one of the first battery 210 and the second battery 220 is decreased, the SOC of the other is increased.

<Requirements>

In recent years, the driving mileage tends to increase due to automatic driving of electric vehicles. As the output of the motor 500 mounted on an electric vehicle increases, the voltage level of the power source of the battery 200 tends to increase. In order to prevent failures from occurring in the power conversion device 400 used under such circumstances, it may be desired to detect deterioration of electrical components included in the power conversion device 400.

<Deterioration of Smoothing Capacitor>

The smoothing capacitor 440 has an insulating resin member including a dielectric member, a positive electrode provided on one surface of the resin member, and a negative electrode provided on the back surface thereof. For example, if a portion of the resin member deteriorates due to heat generation by the energization with a high current, it may become difficult for charges to be stored in the deteriorated portion. As a result, the capacitance of the smoothing capacitor 440 decreases.

When the capacitance of the smoothing capacitor 440 is reduced in this way, charging of the smoothing capacitor 440 may be completed quickly. For example, as shown in FIG. 2, the voltage change becomes faster when the smoothing capacitor 440 is charged.

Figure 2:
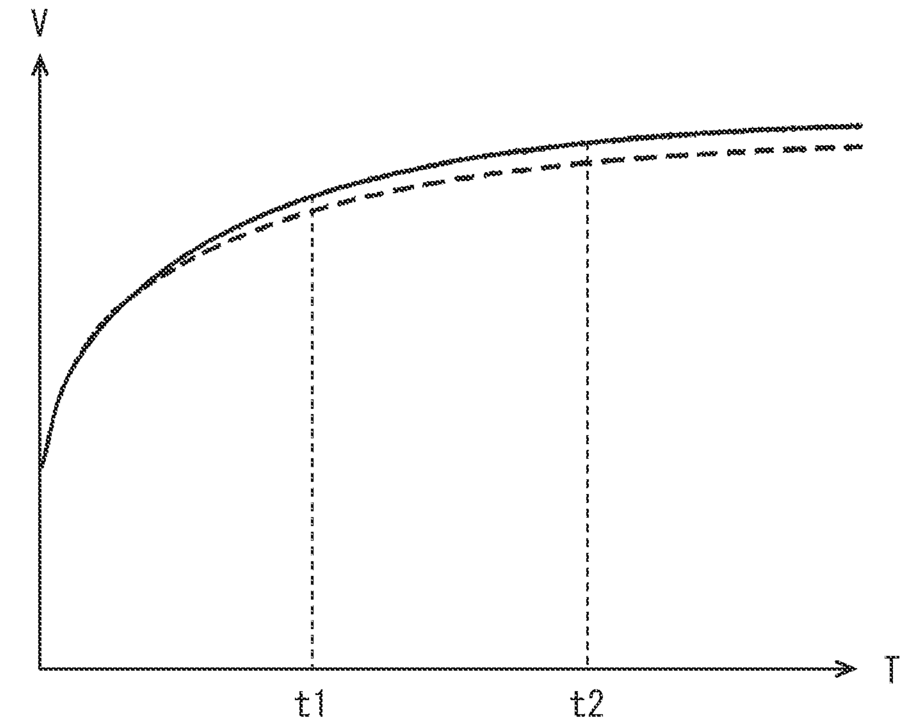
FIG. 2 is a graph showing a time change in the voltage of a smoothing capacitor during charging.

In FIG. 2, the vertical axis indicates voltage and the horizontal axis indicates time. The voltage is denoted by V. The time is denoted by T. A solid line indicates the voltage change of the deteriorated smoothing capacitor 440. A dashed line indicates the voltage change of the un-deteriorated smoothing capacitor 440.

At time t1 and time t2 shown in FIG. 2, the deteriorated smoothing capacitor 440 and the un-deteriorated smoothing capacitor 440 have different voltages and different temporal voltage changes (i.e., the voltage changes). The voltage change of the deteriorated smoothing capacitor 440 during the transitional period (i.e., during charging) from the start to the end of charging is larger than the voltage change of the un-deteriorated smoothing capacitor 440.

Figure 3:
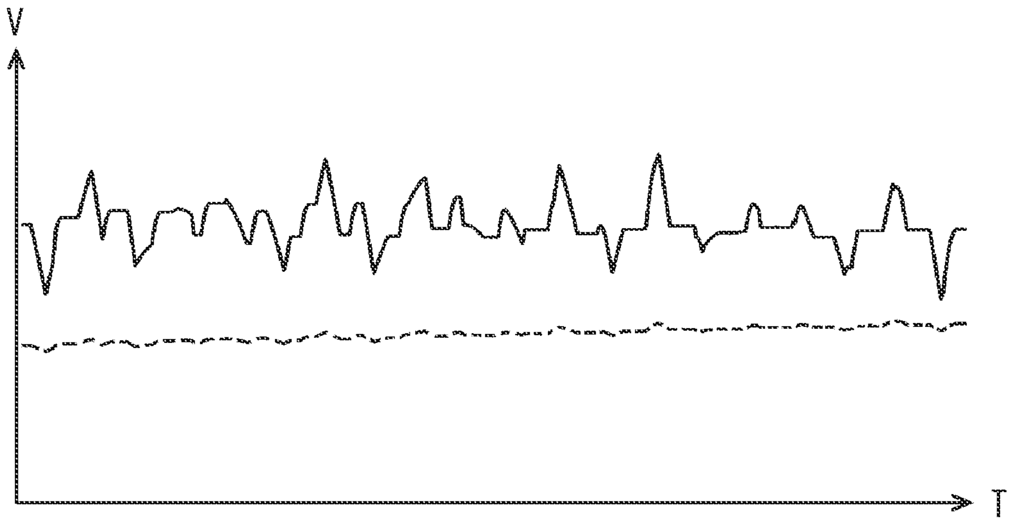
FIG. 3 is a graph showing a time change in the voltage of a smoothing capacitor during PWM control.

Further, when the capacitance of the smoothing capacitor 440 decreases, the smoothing of the voltage by the smoothing capacitor 440 is deteriorated. For example, as shown in FIG. 3, the voltage of the smoothing capacitor 440 in the full charge state during utilizing the capacitor 440 may tend to fluctuate over time. During the usage, the voltage change of the deteriorated smoothing capacitor 440 is greater than the voltage change of the un-deteriorated smoothing capacitor 440.

In FIG. 3, the vertical axis indicates voltage and the horizontal axis indicates time. The voltage is denoted by V and the time is denoted by T. A voltage change of the smoothing capacitor 440 that has deteriorated is indicated by a solid line, and a voltage change of the un-deteriorated smoothing capacitor 440 is indicated by a dashed line.

Note that a case where the smoothing capacitor 440 is used is a situation where the electric power conversion is performed in the electric power conversion device 400 by controlling the switching of a plurality of switches included in the power conversion device 400 between an energization state and a cut-off state. A case where the smoothing capacitor 440 is used is a situation where the flow direction of the current flowing through the smoothing capacitor 440 changes on the order of microseconds due to the electric power conversion. This is the time when the charge/discharge of the smoothing capacitor 440 changes on the order of microseconds due to the electric power conversion.

<Reactor Deterioration>

The reactor 420 has a winding core and windings. A winding wire is an insulated wire having a conductive wire and an insulating coating film covering the conductive wire. The reactor 420 is configured by winding this winding around a winding core. The inductance of the reactor 420 is proportional to the number of turns of this winding.

Due to such a configuration, for example, if the insulating properties of the insulating coating film of the winding are partially deteriorated, the wound winding may partially short-circuit. When such a short circuit occurs, the number of turns of the winding is substantially reduced. As a result, the inductance of the reactor 420 is reduced.

When the inductance of reactor 420 decreases in this way, the current flows easily through the reactor 420. Therefore, the charging of the smoothing capacitor 440 with the power source electric power of the second battery 220 via the reactor 420 may be completed quickly. As shown in FIG. 2, the voltage change becomes faster when the smoothing capacitor 440 is charged. In addition, due to the partial short circuit, the temperature of the reactor 420 is likely to increase due to energization.

<Deterioration Determination>

The calculation unit 408 of the EV ECU 406 sequentially acquires the voltage of the smoothing capacitor 440 from the physical quantity sensor 403 in order to detect deterioration of the smoothing capacitor 440 and the reactor 420. The calculation unit 408 calculates the time change (or the voltage change) of the voltage of the smoothing capacitor 440.

Further, the calculation unit 408 sequentially acquires the temperature of the reactor 420 from the physical quantity sensor 403. The calculation unit 408 calculates the time change (or the temperature change) of the temperature of the reactor 420.

The storage unit 407 of the EV ECU 406 stores the charge determination value and the smoothing determination value as reference values. The charge determination value is determined based on the voltage change of the smoothing capacitor 440 when the smoothing capacitor 440 in the non-deterioration state is charged with the power source electric power of the second battery 220 via the reactor 420 in the non-deteriorated state. The smoothing determination value is determined based on the voltage change of the smoothing capacitor 440 in the non-deteriorated state with full charge when a plurality of switches included in the converter 401 and the inverter 402 are controlled to switch.

At least one of the first temperature determination value and the second temperature determination value is stored in the storage unit 407 as a reference value. The first temperature determination value is determined based on the temperature change of the reactor 420 in the non-deteriorated state during the energization. The second temperature determination value is determined based on the durable temperature of the reactor 420. The EV ECU 406 corresponds to a deterioration determination device.

<Voltage of Smoothing Capacitor>

The calculation unit 408 acquires a voltage change of the smoothing capacitor 440 when the smoothing capacitor 440 is charged. Then, the calculation unit 408 determines whether or not the voltage change is higher (or faster) than the charge determination value. If the voltage change is higher than the charge determination value, the calculation unit 408 determines that at least one of the reactor 420 and the smoothing capacitor 440 has deteriorated. When the voltage change is equal to or less than the charge determination value, the calculation unit 408 determines that the reactor 420 and the smoothing capacitor 440 are normal.

As shown in FIG. 2, regardless of the deterioration state of the smoothing capacitor 440, the voltage change is sharply changed at the start of charging than at the end of charging. The voltage change at time t1 is steeper than the voltage change at time t2. The voltage change is significantly different depending on time.

For this reason, the calculation unit 408 may calculate, for example, a voltage change at a time when the charging of the smoothing capacitor 440 is expected to end (i.e., the expectation charge time), and compare the voltage change with the charge determination value.

This expectation charge time is determined based on the time required to charge the smoothing capacitor 440 in the non-deteriorated state. The expectation charge time is stored in the storage unit 407 as a reference value. The charge determination value is determined based on the voltage change during this expectation charge time.

Note that the expectation charge time may be the time itself required for charging the smoothing capacitor 440 in the non-deteriorated state, or may be shorter than that time. The expectation charge time may be, for example, about 9/10 or 7/8 of that time.

The calculation unit 408 acquires the voltage change of the fully charged smoothing capacitor 440 while driving the electric power conversion device 400. Then, the calculation unit 408 determines whether or not the voltage change is higher (or faster) than the smoothing determination value. When the voltage change is higher than the smoothing determination value, the calculation unit 408 determines that the smoothing capacitor 440 has deteriorated. If the voltage change is equal to or less than the smoothing determination value, the calculation unit 408 determines that the smoothing capacitor 440 is normal.

<Reactor Temperature>

The calculation unit 408 acquires the temperature change of the reactor 420 in the energization state. The calculation unit 408 determines whether the temperature change is higher (or faster) than the first temperature determination value. If the temperature change is higher than the first temperature determination value, the calculation unit 408 determines that the reactor 420 has deteriorated. When the temperature change is equal to or less than the first temperature determination value, the calculation unit 408 determines that the reactor 420 is normal.

Although not shown, it is assumed that the temperature of the reactor 420 may increase exponentially and rapidly when the non-energization state changes to the energization state regardless of the deterioration state of the reactor 420.

Therefore, for example, when the temperature of the reactor 420 becomes equal to or higher than a predetermined temperature, the calculation unit 408 may calculate the temperature change of the reactor 420 and compare the temperature change with the first temperature determination value. This predetermined temperature is stored in the storage unit 407 as a reference value.

Note that the calculation unit 408 may determine whether the temperature of the reactor 420 is higher than the second temperature determination value. If the temperature is higher than the second temperature determination value, the calculation unit 408 determines that the reactor 420 has deteriorated. When the temperature is equal to or less than the second temperature determination value, the calculation unit 408 determines that the reactor 420 is normal. The second temperature determination value is a temperature higher than the predetermined temperature.

<Deterioration Determination Processing>

Next, deterioration determination processing will be described based on FIG. 4. When the ignition switch of the electric vehicle is switched from the off state to the on state, the calculation unit 408 executes deterioration determination processing. The calculation unit 408 repeatedly executes the deterioration determination process as a cycle task. In addition, the start is indicated by S in the drawings. End is indicated by E.

At step S10, the calculation unit 408 determines whether or not the smoothing capacitor 440 is in a charge state. If the smoothing capacitor 440 is in a charge state, the calculation unit 408 proceeds to step S20. If the smoothing capacitor 440 is not in a charge state, the calculation unit 408 proceeds to step S30.

Note that the calculation unit 408 controls charging of the smoothing capacitor 440 When the smoothing capacitor 440 is being charged, the calculation unit 408 acquires the charging start time. This charging start time is stored in the storage unit 407.

When proceeding to step S20, the calculation unit 408 acquires the voltage of the smoothing capacitor 440 from the physical quantity sensor 403. At this time, the calculation unit 408 detects the voltage at different times. Based on these multiple voltages, the calculation unit 408 calculates the voltage change of the smoothing capacitor 440. After this process, in the calculation unit 408, the process proceeds to step S40.

Note that the calculation unit 408 may measure time from the charging start time of the smoothing capacitor 440. Then, in step S20, the calculation unit 408 may calculate a voltage change after the expectation charge time has elapsed from the charging start time.

When proceeding to step S40, the calculation section 408 determines whether or not the voltage change is greater than the charge determination value stored in the storage unit 407. If the voltage change is greater than the charge determination value, the calculation unit 408 proceeds to step S50. If the voltage change is equal to or less than the charge determination value, the calculation unit 408 proceeds to step S60.

When proceeding to step S50, the calculation unit 408 determines that at least one of the reactor 420 and the smoothing capacitor 440 has deteriorated. The calculation unit 408 then stores the deterioration determination in the storage unit 407. At the same time, the calculation unit 408 outputs the deterioration determination to the notification device of the electric vehicle. This notifies the user of the electric vehicle of the deterioration determination. After notification of the deterioration determination, the calculation unit 408 ends the deterioration determination process.

When proceeding to step S60, the calculation unit 408 determines that the reactor 420 and the smoothing capacitor 440 are normal. The calculation unit 408 then stores the normal determination in the storage unit 407. At the same time, the calculation unit 408 outputs the normal determination to the notification device. Thereby, the normal determination is notified to the user. After notification of the normal determination, the calculation unit 408 ends the deterioration determination process.

Retracing the flow, when it is determined in step S10 that the smoothing capacitor 440 is not in a charged state and the process proceeds to step S30, the calculation unit 408 determines whether or not the power conversion device 400 is performing electric power conversion. That is, the calculation unit 408 determines whether or not the switch included in the power conversion device 400 is controlled to be switched. When the switching is controlled, the calculation unit 408 proceeds to step S70. If the switching control is not performed, the calculation unit 408 terminates the deterioration determination process.

When proceeding to step S70, the calculation unit 408 acquires the voltage of the smoothing capacitor 440 and the temperature of the reactor 420 from the physical quantity sensor 403. At this time, the calculation unit 408 detects the voltage and the temperature at different times. Based on this, the calculation unit 408 calculates the voltage change and the temperature change. After this process, in the calculation unit 408, the process proceeds to step S80.

The temperature change may be calculated when the temperature of the reactor 420 reaches or exceeds a predetermined temperature. Moreover, when the deterioration determination of the reactor 420 is performed based on the temperature of the reactor 420, it may not be necessary to calculate the temperature change.

When proceeding to step S80, the calculation section 408 determines whether or not the voltage change is greater than the smoothing determination value stored in the storage unit 407. If the voltage change is greater than the smoothing determination value, the calculation unit 408 proceeds to step S90. If the voltage change is equal to or less than the smoothing determination value, the calculation unit 408 proceeds to step S100.

When proceeding to step S90, the calculation unit 408 determines that the smoothing capacitor 440 has deteriorated. Then, the calculation unit 408 stores the deterioration determination of the smoothing capacitor 440 in the storage unit 407. At the same time, the calculation unit 408 outputs the deterioration determination of the smoothing capacitor 440 to the notification device. Thereby, the deterioration determination of the smoothing capacitor 440 is notified to the user. After this process, in the calculation unit 408, the process proceeds to step S110.

When proceeding to step S100, the calculation unit 408 determines that the smoothing capacitor 440 is normal. Then, the calculation unit 408 stores the normal determination of the smoothing capacitor 440 in the storage unit 407. At the same time, the calculation unit 408 outputs the normal determination of the smoothing capacitor 440 to the notification device. Thereby, the normal determination of the smoothing capacitor 440 is notified to the user. After this process, in the calculation unit 408, the process proceeds to step S110.

In step S110, the calculation unit 408 determines whether the temperature change or temperature is greater than the first temperature determination value or the second temperature determination value stored in the storage unit 407. When performing the deterioration determination based on the temperature change, the calculation unit 408 determines whether the temperature change is greater than the first temperature determination value. When performing the deterioration determination based on the temperature, the calculation unit 408 determines whether the temperature is higher than the second temperature determination value.

When the temperature change and the temperature are collectively referred to as the temperature state, and the first temperature determination value and the second temperature determination value are collectively referred to as the temperature determination value, then in step S110, the calculation unit 408 determines whether the temperature state of the reactor 420 is greater (or higher) than the temperature determination value. When the temperature state is larger than the temperature determination value, the calculation unit 408 proceeds to step S120. If the temperature state is equal to or lower than the temperature determination value, the calculation unit 408 proceeds to step S130.

When proceeding to step S120, the calculation unit 408 determines that the reactor 420 has deteriorated. Then, the calculation unit 408 stores the deterioration determination of the reactor 420 in the storage unit 407. At the same time, the calculation unit 408 outputs the deterioration determination of the reactor 420 to the notification device. Thereby, the deterioration determination of the reactor 420 is notified to the user. After the deterioration notification of the reactor 420, the calculation unit 408 terminates the deterioration determination process.

Upon proceeding to step S130, the calculation unit 408 determines that the reactor 420 is normal. Then, the calculation unit 408 stores the normal determination of the reactor 420 in the storage unit 407. At the same time, the calculation unit 408 outputs the normal determination of the reactor 420 to the notification device. Thereby, the normal determination of the reactor 420 is notified to the user. After the normal notification of the reactor 420, the calculation unit 408 terminates the deterioration determination process.

The execution order of the state determination processing of the smoothing capacitor 440 in steps S80 to S100 and the state determination processing of the reactor 420 in steps S110 to S130 may not be particularly limited. The execution order of these two types of state determination processing may be reversed from the execution order shown in FIG. 4.

As described above, the smoothing capacitor 440 is charged when the power conversion device 400 is not in use. After charging the smoothing capacitor 440, the power conversion device 400 is used. Therefore, after the processing of steps S20 and steps S40 to S60 shown in FIG. 4, the processing of steps S30 and steps S70 to S130 is executed. That is, after the combination of deterioration determination of the reactor 420 and the smoothing capacitor 440, the deterioration determination of the reactor 420 and the deterioration determination of the smoothing capacitor 440 are performed individually.

Therefore, for example, when the deterioration determination of step S50 is performed, it is expected that at least one of step S90 and step S120 is performed. If the determination of normality in step S60 is performed, it is expected that steps S100 and S130 will each be performed.

If these expectations are not met, the calculation unit 408 determines that the reliability of the deterioration determination and the normality determination is low. If the reliability of the determination is low, the calculation unit 408 may output a determination error display to the notification device. This notifies the user of the determination error.

Figure 4:
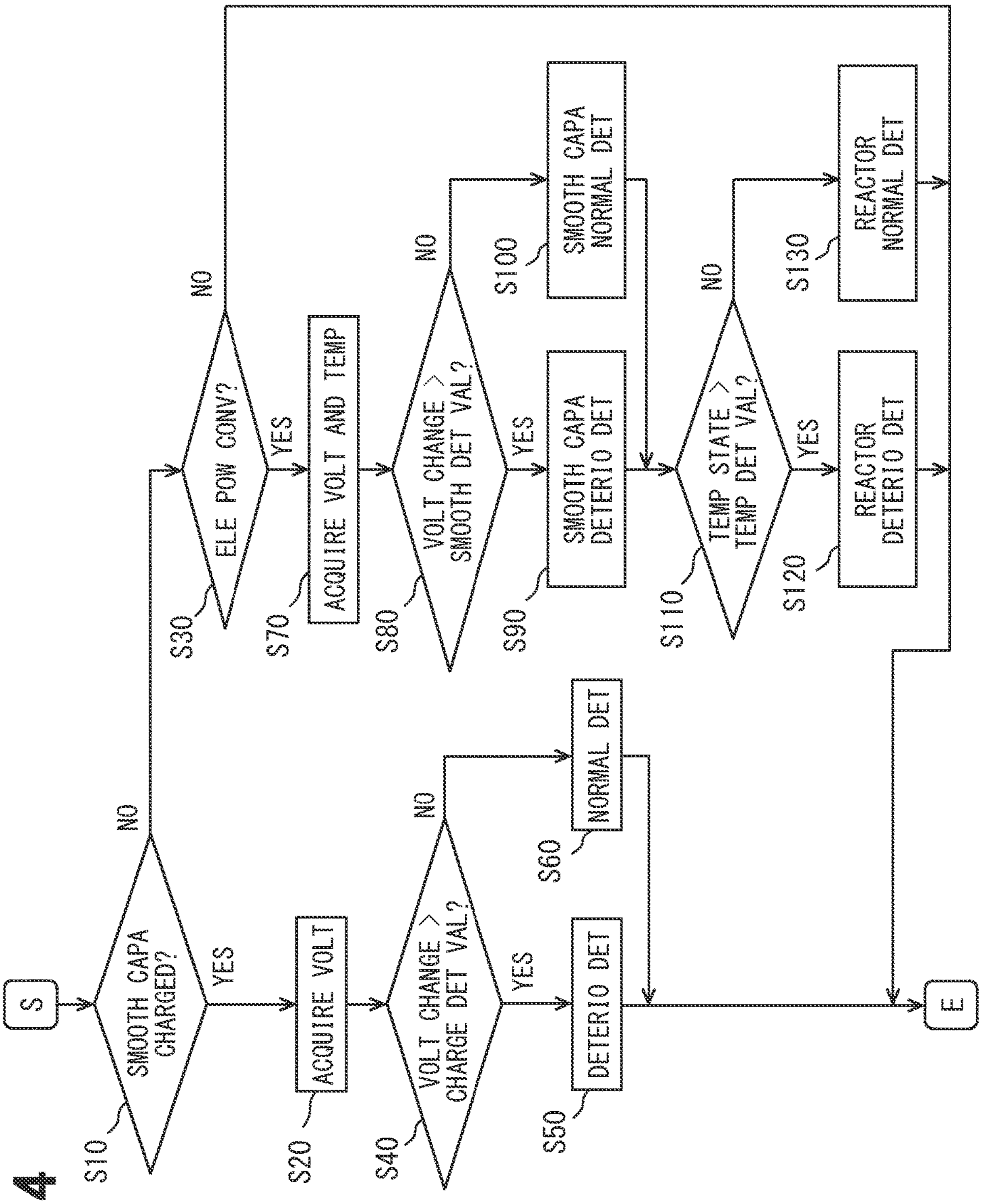
FIG. 4 is a flowchart showing deterioration determination processing.

Note that, different from the deterioration determination process shown in FIG. 4, the deterioration determination of the reactor 420 may be performed when the electric power conversion is not being performed in the electric power conversion device 400. The deterioration determination of the reactor 420 can be performed when the current is flowing through the reactor 420.

For example, the deterioration determination of the reactor 420 may be performed after step S50 or step S60. The deterioration determination of the reactor 420 may be performed while the first SMR 310 and the second SMR 320 are controlled to be in the energization state in order to adjust the SOC of the first battery 210 and the SOC of the second battery 220.

Then, if it is determined that at least one of the reactor 420 and the smoothing capacitor 440 has deteriorated, the calculation unit 408 may determine the drive restriction of the power conversion device 400. The drive restriction is, for example, the limitation of the amount of current energized by the power conversion device 400 and the limitation of the applied voltage. Further, the calculation unit 408 may determine to strengthen the cooling performance of the power conversion device 400 by the cooler.

<Operations and Effects>

As described above, if the change in voltage of the smoothing capacitor 440 during charging is greater than the charge determination value, the calculation unit 408 determines that at least one of the reactor 420 and the smoothing capacitor 440 has deteriorated. Conversely, if the change in voltage of the smoothing capacitor 440 during charging is equal to or less than the charge determination value, the calculation unit 408 determines that the reactor 420 and the smoothing capacitor 440 are normal.

In this manner, the deterioration determination of the reactor 420 and the smoothing capacitor 440 can be performed together only by detecting a voltage change during charging. Thus, the deterioration determination of different types of passive elements can be performed.

When the temperature state of the reactor 420 in the energization state is higher than the temperature determination value, the calculation unit 408 determines that the reactor 420 has deteriorated. When the voltage change of the fully charged smoothing capacitor 440 during switching control is higher than the smoothing determination value, the calculation unit 408 determines that the smoothing capacitor 440 has deteriorated.

In this way, the deterioration of the reactor 420 and the smoothing capacitor 440 can be determined individually. Therefore, for example, if the reactor 420 and the smoothing capacitor 440 are individually replaceable modules from the power conversion device 400, only the failure module can be replaced among these two modules.

Second Embodiment

Next, a second embodiment will be described with reference to FIG. 5.

In the first embodiment, the deterioration determination of the reactor 420 and the smoothing capacitor 440 is performed based on the voltage change and the charge determination value when the smoothing capacitor 440 is charged. On the other hand, in the present embodiment, the deterioration determination of the reactor 420 and the smoothing capacitor 440 is performed based on the charging time of the smoothing capacitor 440.

Figure 5:
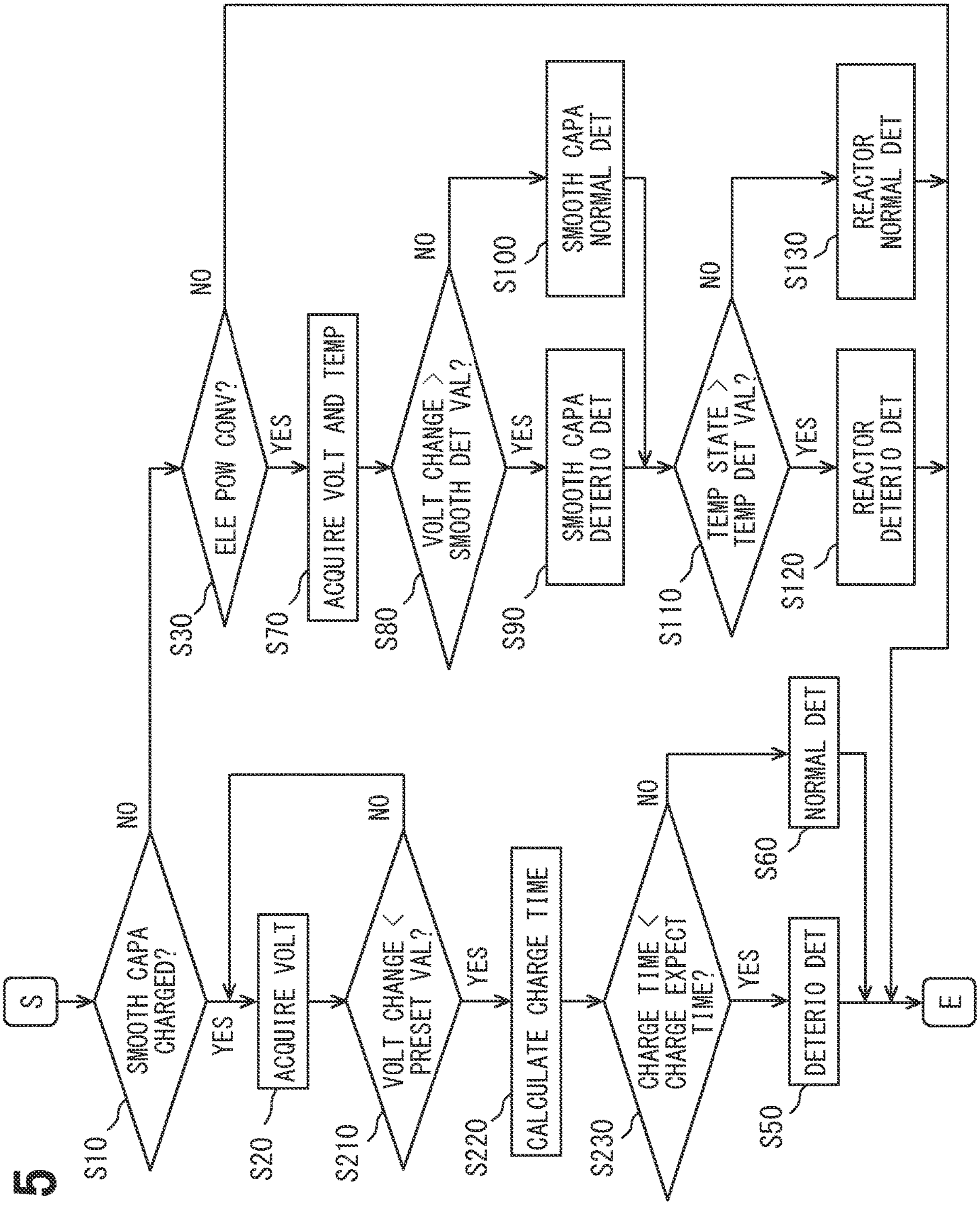
FIG. 5 is a flowchart showing deterioration determination processing.

In this case, the calculation unit 408 executes the deterioration determination process shown in FIG. 5. While the smoothing capacitor 440 is being charged, the calculation unit 408 executes steps S210 to S230 instead of step S40.

As described in the first embodiment, the calculation unit 408 acquires the voltage of the charged smoothing capacitor 440 at different times in step S20. Then, the calculation unit 408 calculates the voltage change. After this process, in the calculation unit 408, the process proceeds to step S210.

When proceeding to step S210, the calculation unit 408 determines whether or not the voltage change has become smaller than a predetermined value. If the voltage change is not smaller than the predetermined value, the calculation unit 408 repeatedly executes steps S20 and S210. The calculation unit 408 enters a standby state. When the voltage change becomes smaller than the predetermined value because the smoothing capacitor 440 is close to a fully charged state, the calculation unit 408 proceeds to step S220.

Note that the predetermined value described above is a value larger than the voltage detection error. The predetermined value is a value for determining whether the smoothing capacitor 440 is fully charged. The predetermined value is stored in the storage unit 407 as a reference value.

When proceeding to step S220, the calculation unit 408 calculates the charging time of the smoothing capacitor 440 based on the time when the voltage change becomes smaller than a predetermined value and the charging start time of the smoothing capacitor 440. After this process, in the calculation unit 408, the process proceeds to step S230.

When proceeding to step S230, the calculation unit 408 determines whether or not the charging time is shorter than the expectation charge time. If the charging time is shorter than the expectation charge time, the calculation unit 408 proceeds to step S50. If the charging time is equal to or longer than the expectation charge time, the calculation unit 408 proceeds to step S60.

The power conversion device 400 according to the present embodiment includes components equivalent to those of the power conversion device 400 according to the first embodiment. Therefore, it is expected that the power conversion device 400 of the present embodiment has the same effect as the power conversion device 400 described in the first embodiment. Therefore, the description will be omitted.

Although the present disclosure has been described in accordance with the embodiment, it is understood that the present disclosure is not limited to the embodiment and the structure. The present disclosure covers various modifications and equivalent arrangements. In addition, while the various elements are shown in various combinations and configurations, which are exemplary, other combinations and configurations, including one or more elements, or one-less element or further, are also within the spirit and scope of the present disclosure.

It is noted that a flowchart or the processing of the flowchart in the present application includes sections (also referred to as steps), each of which is represented, for instance, as S10. Further, each section can be divided into several sub-sections while several sections can be combined into a single section. Furthermore, each of thus configured sections can be also referred to as a device, module, or means.

What is claimed is:

1. A deterioration determination device that determines deterioration of a reactor and a smoothing capacitor included in a power conversion device, the deterioration determination device comprising:

a storage unit that stores a charge determination value based on a voltage change when the smoothing capacitor with no deterioration is charged by a power source electric power supplied through the reactor with no deterioration; and a calculation unit that determines that at least one of the reactor and the smoothing capacitor has deteriorated when the voltage change of the smoothing capacitor during charging by the power source electric power supplied through the reactor is larger than the charge determination value, wherein:

the storage unit stores a temperature determination value for determining a temperature state of the reactor;

the calculation unit determines that the reactor has deteriorated when a temperature of the reactor is higher than the temperature determination value;

the storage unit stores a smoothing determination value based on the voltage change of the smoothing capacitor with no deterioration in a full charge state when a plurality of switches included in the power conversion device are controlled to switch between an energization state and a cut off state; and the calculation unit determines that the smoothing capacitor has deteriorated when a voltage change of the smoothing capacitor in a full charge state during a switching control is greater than the smoothing determination value.

2. A deterioration determination device that determines deterioration of a reactor and a smoothing capacitor included in a power conversion device, the deterioration determination device comprising:

a storage unit that stores a charge expectation time expected for completion of charging of the smoothing capacitor with no deterioration by a power source electric power supplied through the reactor with no deterioration; and a calculation unit that determines that at least one of the reactor and the smoothing capacitor has deteriorated when a charging time from a start to an end of charging of the smoothing capacitor with the power source electric power supplied through the reactor is shorter than the charge expectation time, wherein:

the storage unit stores a temperature determination value for determining a temperature state of the reactor;

the calculation unit determines that the reactor has deteriorated when a temperature of the reactor is higher than the temperature determination value;

the storage unit stores a smoothing determination value based on a voltage change of the smoothing capacitor with no deterioration in a full charge state when a plurality of switches included in the power conversion device are controlled to switch between an energization state and a cut off state; and the calculation unit determines that the smoothing capacitor has deteriorated when a voltage change of the smoothing capacitor in a full charge state during a switching control is greater than the smoothing determination value.

3. A deterioration determination device that determines deterioration of a reactor and a smoothing capacitor included in a power conversion device, the deterioration determination device comprising:

a storage unit that stores a charge determination value based on a voltage change when the smoothing capacitor with no deterioration is charged by a power source electric power supplied through the reactor with no deterioration; and a calculation unit that determines that at least one of the reactor and the smoothing capacitor has deteriorated when the voltage change of the smoothing capacitor during charging by the power source electric power supplied through the reactor is larger than the charge determination value, wherein:

the storage unit stores a smoothing determination value based on the voltage change of the smoothing capacitor with no deterioration in a full charge state when a plurality of switches included in the power conversion device are controlled to switch between an energization state and a cut off state; and the calculation unit determines that the smoothing capacitor has deteriorated when a voltage change of the smoothing capacitor in a full charge state during a switching control is greater than the smoothing determination value.

4. A deterioration determination device that determines deterioration of a reactor and a smoothing capacitor included in a power conversion device, the deterioration determination device comprising:

a storage unit that stores a charge expectation time expected for completion of charging of the smoothing capacitor with no deterioration by a power source electric power supplied through the reactor with no deterioration; and a calculation unit that determines that at least one of the reactor and the smoothing capacitor has deteriorated when a charging time from a start to an end of charging of the smoothing capacitor with the power source electric power supplied through the reactor is shorter than the charge expectation time, wherein:

the storage unit stores a smoothing determination value based on a voltage change of the smoothing capacitor with no deterioration in a full charge state when a plurality of switches included in the power conversion device are controlled to switch between an energization state and a cut off state; and the calculation unit determines that the smoothing capacitor has deteriorated when a voltage change of the smoothing capacitor in a full charge state during a switching control is greater than the smoothing determination value.

5. A deterioration determination device that determines deterioration of a reactor and a smoothing capacitor included in a power conversion device, the deterioration determination device comprising:

a storage unit that stores a charge determination value based on a voltage change when the smoothing capacitor with no deterioration is charged by a power source electric power supplied through the reactor with no deterioration; and a calculation unit that determines that at least one of the reactor and the smoothing capacitor has deteriorated when the voltage change of the smoothing capacitor during charging by the power source electric power supplied through the reactor is larger than the charge determination value, wherein:

the storage unit stores a temperature determination value for determining a temperature state of the reactor, and a smoothing determination value based on a voltage change of the smoothing capacitor with no deterioration in a full charge state when a plurality of switches included in the power conversion device are controlled to switch between an energization state and a cut off state;

the calculation unit determines that only the reactor among the reactor and the smoothing capacitor has deteriorated when a temperature of the reactor is higher than the temperature determination value and the voltage change of the smoothing capacitor in the full charge state during a switching control is lower than the smoothing determination value; and the calculation unit determines that only the smoothing capacitor among the reactor and the smoothing capacitor has deteriorated when the temperature of the reactor is lower than the temperature determination value and the voltage change of the smoothing capacitor in the full charge state during the switching control is higher than the smoothing determination value.

6. A deterioration determination device that determines deterioration of a reactor and a smoothing capacitor included in a power conversion device, the deterioration determination device comprising:

a storage unit that stores a charge expectation time expected for completion of charging of the smoothing capacitor with no deterioration by a power source electric power supplied through the reactor with no deterioration; and a calculation unit that determines that at least one of the reactor and the smoothing capacitor has deteriorated when a charging time from a start to an end of charging of the smoothing capacitor with the power source electric power supplied through the reactor is shorter than the charge expectation time, wherein:

the storage unit stores a temperature determination value for determining a temperature state of the reactor, and a smoothing determination value based on a voltage change of the smoothing capacitor with no deterioration in a full charge state when a plurality of switches included in the power conversion device are controlled to switch between an energization state and a cut off state;

the calculation unit determines that only the reactor among the reactor and the smoothing capacitor has deteriorated when a temperature of the reactor is higher than the temperature determination value and the voltage change of the smoothing capacitor in the full charge state during a switching control is lower than the smoothing determination value; and the calculation unit determines that only the smoothing capacitor among the reactor and the smoothing capacitor has deteriorated when the temperature of the reactor is lower than the temperature determination value and the voltage change of the smoothing capacitor in the full charge state during the switching control is higher than the smoothing determination value.

7. A power conversion device comprising:

a reactor to which a power source electric power is supplied;

a smoothing capacitor that is charged by the power source electric power supplied through the reactor;

a storage unit that stores a charge determination value based on a voltage change when the smoothing capacitor with no deterioration is charged by the power source electric power supplied through the reactor with no deterioration; and a calculation unit that determines that at least one of the reactor and the smoothing capacitor has deteriorated when the voltage change of the smoothing capacitor during charging is higher than the charge determination value, wherein:

the storage unit stores a temperature determination value for determining a temperature state of the reactor;

the calculation unit determines that the reactor has deteriorated when a temperature of the reactor is higher than the temperature determination value;

the storage unit stores a smoothing determination value based on the voltage change of the smoothing capacitor with no deterioration in a full charge state when a plurality of switches included in the power conversion device are controlled to switch between an energization state and a cut off state; and the calculation unit determines that the smoothing capacitor has deteriorated when a voltage change of the smoothing capacitor in a full charge state during a switching control is greater than the smoothing determination value.

8. A power conversion device comprising:

a reactor to which a power source electric power is supplied;

a smoothing capacitor that is charged by the power source electric power supplied through the reactor;

a storage unit that stores a charge expectation time expected for completion of charging of the smoothing capacitor with no deterioration by the power source electric power supplied through the reactor with no deterioration; and a calculation unit that determines that at least one of the reactor and the smoothing capacitor has deteriorated when a charging time from a start to an end of charging of the smoothing capacitor is shorter than the charge expectation time, wherein:

the storage unit stores a temperature determination value for determining a temperature state of the reactor;

the calculation unit determines that the reactor has deteriorated when a temperature of the reactor is higher than the temperature determination value;

the storage unit stores a smoothing determination value based on a voltage change of the smoothing capacitor with no deterioration in a full charge state when a plurality of switches included in the power conversion device are controlled to switch between an energization state and a cut off state; and the calculation unit determines that the smoothing capacitor has deteriorated when a voltage change of the smoothing capacitor in a full charge state during a switching control is greater than the smoothing determination value.

9. A power conversion device comprising:

a reactor to which a power source electric power is supplied;

a smoothing capacitor that is charged by the power source electric power supplied through the reactor;

a storage unit that stores a charge determination value based on a voltage change when the smoothing capacitor with no deterioration is charged by the power source electric power supplied through the reactor with no deterioration; and a calculation unit that determines that at least one of the reactor and the smoothing capacitor has deteriorated when the voltage change of the smoothing capacitor during charging is higher than the charge determination value, wherein:

the storage unit stores a smoothing determination value based on the voltage change of the smoothing capacitor with no deterioration in a full charge state when a plurality of switches included in the power conversion device are controlled to switch between an energization state and a cut off state; and the calculation unit determines that the smoothing capacitor has deteriorated when a voltage change of the smoothing capacitor in a full charge state during a switching control is greater than the smoothing determination value.

10. A power conversion device comprising:

a reactor to which a power source electric power is supplied;

a smoothing capacitor that is charged by the power source electric power supplied through the reactor;

a storage unit that stores a charge expectation time expected for completion of charging of the smoothing capacitor with no deterioration by the power source electric power supplied through the reactor with no deterioration; and a calculation unit that determines that at least one of the reactor and the smoothing capacitor has deteriorated when a charging time from a start to an end of charging of the smoothing capacitor is shorter than the charge expectation time, wherein:

the storage unit stores a smoothing determination value based on a voltage change of the smoothing capacitor with no deterioration in a full charge state when a plurality of switches included in the power conversion device are controlled to switch between an energization state and a cut off state; and the calculation unit determines that the smoothing capacitor has deteriorated when a voltage change of the smoothing capacitor in a full charge state during a switching control is greater than the smoothing determination value.

11. A power conversion device comprising:

a reactor to which a power source electric power is supplied;

a smoothing capacitor that is charged by the power source electric power supplied through the reactor;

a storage unit that stores a charge determination value based on a voltage change when the smoothing capacitor with no deterioration is charged by the power source electric power supplied through the reactor with no deterioration; and a calculation unit that determines that at least one of the reactor and the smoothing capacitor has deteriorated when the voltage change of the smoothing capacitor during charging is higher than the charge determination value, wherein:

the storage unit stores a temperature determination value for determining a temperature state of the reactor, and a smoothing determination value based on a voltage change of the smoothing capacitor with no deterioration in a full charge state when a plurality of switches included in the power conversion device are controlled to switch between an energization state and a cut off state;

the calculation unit determines that only the reactor among the reactor and the smoothing capacitor has deteriorated when a temperature of the reactor is higher than the temperature determination value and the voltage change of the smoothing capacitor in the full charge state during a switching control is lower than the smoothing determination value; and the calculation unit determines that only the smoothing capacitor among the reactor and the smoothing capacitor has deteriorated when the temperature of the reactor is lower than the temperature determination value and the voltage change of the smoothing capacitor in the full charge state during the switching control is higher than the smoothing determination value.

12. A power conversion device comprising:

a reactor to which a power source electric power is supplied;

a smoothing capacitor that is charged by the power source electric power supplied through the reactor;

a storage unit that stores a charge expectation time expected for completion of charging of the smoothing capacitor with no deterioration by the power source electric power supplied through the reactor with no deterioration; and a calculation unit that determines that at least one of the reactor and the smoothing capacitor has deteriorated when a charging time from a start to an end of charging of the smoothing capacitor is shorter than the charge expectation time, wherein:

the storage unit stores a temperature determination value for determining a temperature state of the reactor, and a smoothing determination value based on a voltage change of the smoothing capacitor with no deterioration in a full charge state when a plurality of switches included in the power conversion device are controlled to switch between an energization state and a cut off state;

the calculation unit determines that only the reactor among the reactor and the smoothing capacitor has deteriorated when a temperature of the reactor is higher than the temperature determination value and the voltage change of the smoothing capacitor in the full charge state during a switching control is lower than the smoothing determination value; and the calculation unit determines that only the smoothing capacitor among the reactor and the smoothing capacitor has deteriorated when the temperature of the reactor is lower than the temperature determination value and the voltage change of the smoothing capacitor in the full charge state during the switching control is higher than the smoothing determination value.

* * * * *